(12) United States Patent
Oganesian et al.

(10) Patent No.: US 9,985,063 B2
(45) Date of Patent: May 29, 2018

(54) IMAGING DEVICE WITH PHOTO DETECTORS AND COLOR FILTERS ARRANGED BY COLOR TRANSMISSION CHARACTERISTICS AND ABSORPTION COEFFICIENTS

(71) Applicant: Optiz, Inc., Palo Alto, CA (US)

(72) Inventors: Vage Oganesian, Sunnyvale, CA (US); Zhenhua Lu, East Palo Alto, CA (US)

(73) Assignee: Optiz, Inc., Palo Alto, CA (US)

( * ) Notice: Subject to any disclaimer, the term of this patent is extended or adjusted under 35 U.S.C. 154(b) by 150 days.

(21) Appl. No.: 14/618,510

(22) Filed: Feb. 10, 2015

(65) Prior Publication Data

US 2015/0303231 A1 Oct. 22, 2015

Related U.S. Application Data

(60) Provisional application No. 61/982,562, filed on Apr. 22, 2014.

(51) Int. Cl.
*H01L 27/146* (2006.01)

(52) U.S. Cl.
CPC .. *H01L 27/14621* (2013.01); *H01L 27/14603* (2013.01); *H01L 27/14667* (2013.01)

(58) Field of Classification Search
CPC ......... H01L 27/14603; H01L 27/14621; H01L 27/14667; H01L 27/14645; H01L 27/14647; H04N 2209/045
USPC ..................................................... 250/208.1
See application file for complete search history.

(56) References Cited

U.S. PATENT DOCUMENTS

| | | | |
|---|---|---|---|
| 3,971,065 A | 7/1976 | Bayer | |
| 5,677,200 A * | 10/1997 | Park | ................. H01L 27/14621 257/432 |
| 6,137,100 A | 10/2000 | Fossum et al. | |
| 6,777,767 B2 | 8/2004 | Badehi | |
| 6,972,480 B2 | 12/2005 | Zilber et al. | |

(Continued)

FOREIGN PATENT DOCUMENTS

| | | |
|---|---|---|
| CN | 102956655 A | 3/2013 |
| JP | 2004228645 A | 8/2004 |

(Continued)

OTHER PUBLICATIONS

U.S. Appl. No. 13/157,193, filed Jun. 9, 2011, Oganesian, Vage.

(Continued)

*Primary Examiner* — Seung C Sohn
(74) *Attorney, Agent, or Firm* — DLA Piper LLP (US)

(57) ABSTRACT

An imaging device that includes an array of photo detectors each configured to generate an electrical signal in response to received light, and an array of color filters disposed over the array of photo detectors such that the photo detectors receive light passing through the color filters. Each of the color filters has a color transmission characteristic, which vary. To even out color balance, some of the color filters are disposed over a plurality of the photo detectors while others are disposed over only one of the photo detectors. Additional color balance can be achieved by varying the relative area sizes of the color filters and underlying photo detectors based on color transmission characteristics, to compensate for the varying absorption coefficient of the photo detectors at different colors.

18 Claims, 12 Drawing Sheets

(56) References Cited

U.S. PATENT DOCUMENTS

| | | |
|---|---|---|
| 7,033,664 B2 | 4/2006 | Zilber et al. |
| 7,157,742 B2 | 1/2007 | Badehi |
| 7,192,796 B2 | 3/2007 | Zilber et al. |
| 7,214,998 B2* | 5/2007 | Wu .................. H01L 27/14603 250/208.1 |
| 7,265,440 B2 | 9/2007 | Zilber et al. |
| 7,495,341 B2 | 2/2009 | Zilber et al. |
| 7,642,629 B2 | 1/2010 | Zilber et al. |
| 7,859,033 B2 | 12/2010 | Brady |
| 7,923,799 B2 | 4/2011 | Lenchenkov |
| 8,692,344 B2 | 4/2014 | Oganesian |
| 2004/0251525 A1 | 12/2004 | Zilber |
| 2005/0104179 A1 | 5/2005 | Zilber |
| 2005/0205977 A1 | 9/2005 | Zilber |
| 2006/0186322 A1* | 8/2006 | Matsuyama ...... H01L 27/14621 250/226 |
| 2007/0138498 A1 | 6/2007 | Zilber |
| 2007/0153104 A1* | 7/2007 | Ellis-Monaghan .... H04N 9/045 348/272 |
| 2007/0190691 A1 | 8/2007 | Humpston |
| 2007/0190747 A1 | 8/2007 | Humpston |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0099900 A1 | 5/2008 | Oganesian |
| 2008/0099907 A1 | 5/2008 | Oganesian |
| 2008/0116544 A1 | 5/2008 | Grinman |
| 2008/0116545 A1 | 5/2008 | Grinman |
| 2008/0150121 A1 | 6/2008 | Oganesian |
| 2008/0246136 A1 | 10/2008 | Haba |
| 2009/0008735 A1* | 1/2009 | Ogino ............... H01L 27/14601 257/436 |
| 2009/0115047 A1 | 5/2009 | Haba |
| 2009/0160065 A1 | 6/2009 | Haba |
| 2009/0200625 A1 | 8/2009 | Venezia et al. |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian et al. |
| 2012/0199924 A1 | 8/2012 | Oganesian et al. |
| 2012/0199925 A1 | 8/2012 | Oganesian et al. |
| 2012/0199926 A1 | 8/2012 | Oganesian |
| 2013/0050562 A1* | 2/2013 | Nakata .................. G02B 5/201 348/336 |

FOREIGN PATENT DOCUMENTS

| | | |
|---|---|---|
| TW | 201030964 | 8/2010 |
| WO | 02/49367 A2 | 6/2002 |
| WO | 2012039180 A1 | 3/2012 |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/609,002, filed Sep. 10, 2012, Oganesian, Vage.

* cited by examiner

IMAGING DEVICE WITH PHOTO DETECTORS AND COLOR FILTERS ARRANGED BY COLOR TRANSMISSION CHARACTERISTICS AND ABSORPTION COEFFICIENTS

RELATED APPLICATIONS

This application claims the benefit of U.S. Provisional Application No. 61/982,562, filed Apr. 22, 2014, and which is incorporated herein by reference.

Field of the Invention

The present invention relates to image sensors, and more particularly to the configuration of the color filters and the photodiodes.

Background of the Invention

Digital image sensors have been popularized in the recent years. Such sensors are used in digital cameras, mobile devices, endoscopes, etc. Conventional digital image sensors have an array of pixel structures, where each pixel contains a microlens, a color filter, and a photo detector such as a photodiode. The photo detector generates an output electrical signal in response to received light, where the output signal is fed to a read-out circuit. The structures and manufacturing process of the aforementioned components are all well known in the art.

Figure 1:
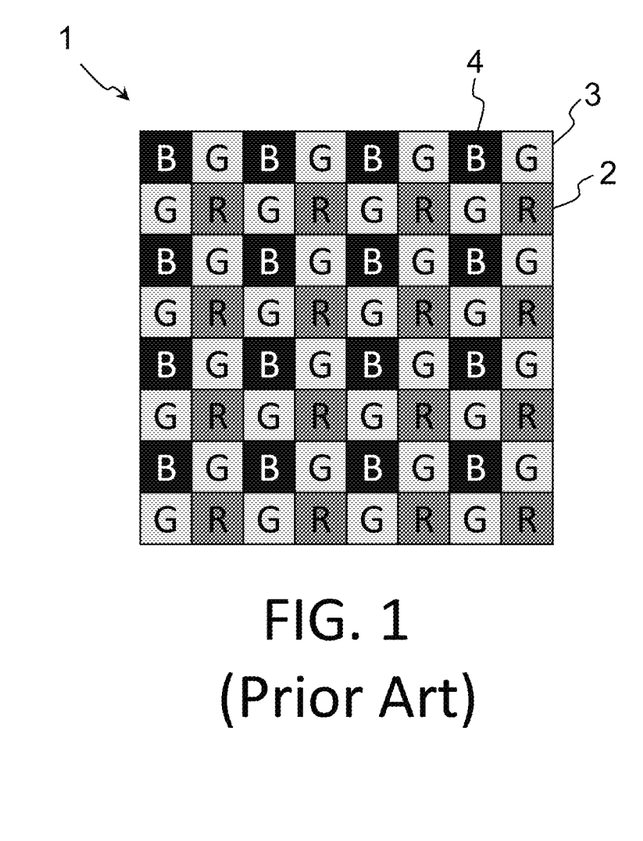
FIG. 1 is a schematic top view of a conventional color filter pattern.

With respect to the color filter, it is also known in the art to apply an array of luminance and chrominance sensitive elements (i.e. color filters) over the photo detectors in a specific and repeating pattern. See for example U.S. Pat. No. 3,971,065, which is incorporated herein by reference. One of the mostly commonly used color filter patterns is known as the Bayer pattern of color filters 1, which is shown in FIG. 1 and includes an array of red filters (R) 2, green filters (G) 3 and blue filters (B) 4. While only a few rows and columns are shown, this pattern can include millions of such filters. The color filter pattern has odd row patterns of alternating blue and green filters 4/3, and even row patterns of alternating green and red filters 3/2, as well as odd column patterns of alternating blue and green filters 4/3, and even column patterns of alternating green and red filters 3/2. Therefore, the overall pattern contains 50% green filters 3, 25% red filters 2, and 25% blue filters 4. Typically each filter 2/3/4 is disposed over a single photo detector so that each photo detector detects just a single color of light at that position of the image sensor.

The trend of image sensor miniaturization and pixel micronization has adversely affected the photonic efficiency of pixels, which is especially true for the pixels that are on the edges of the pixel array. Reducing the pixel size causes considerable deterioration in the quantum efficiency, the color signal-to-noise ratio (S/N ratio) and the luminance S/N ratio for the various pixels. However, this miniaturization trend has also given the image sensor enough resolution to accommodate advanced color filter patterns, new filter colors, new shades, and even a better transparent (white) color filter.

It has been realized that luminance S/N ratio can be improved by using green filters or white filters (which includes green—a white filter is either transparent (i.e. passes most or all of most colors of light) or is a gap or aperture in the filter array). This luminance improvement technique can be seen in the traditional Bayer filter which utilizes 50% green color filters.

The color S/N ratio has been largely ignored by the industry in favor of luminance S/N ratio because it is more noticeable to the human perception. However, due to the reduction in quantum efficiency through micronization of pixel size, the color S/N ratio has become a growing issue, especially since the industry standard Bayer pattern and many other well-known advanced color filter patterns all lean toward favoring luminance S/N ratio in a manner which forfeits ever more color S/N ratio. For example, the Bayer pattern uses 50% green, 25% red and 25% blue, and the typical well known RGBW pattern uses 25% white, 25% green, 25% red and 25% blue. These pattern designs do not correspond well to the absorption coefficients of colors in silicon, as shown in table 1 below:

TABLE 1

| Color | Wavelength (nm) | Absorption coefficient (1/cm) |
| --- | --- | --- |
| Blue | 475 | 1,6000 |
| Green | 510 | 9700 |
| Red | 650 | 2810 |

Silicon has a greater absorption of blue compared to green, and a greater absorption of green compared to red.

Therefore, there is a need for a color filter design and configuration to further improve the digital image sensor while maintaining acceptable levels of luminance S/N ratio, color S/N ratio and quantum efficiency, especially for pixels located on the edges of the pixel array.

BRIEF SUMMARY OF THE INVENTION

The aforementioned problems and needs are addressed by an imaging device that includes an array of photo detectors each configured to generate an electrical signal in response to received light, and an array of color filters disposed over the array of photo detectors such that the photo detectors receive light passing through the color filters. Each of the color filters has a color transmission characteristic. The color transmission characteristic of some of the color filters is different from that of others of the color filters. Each of a first plurality of the color filters is disposed over a plurality of the photo detectors. Each of a second plurality of the color filters is disposed over only one of the photo detectors.

An imaging device includes an array of photo detectors each configured to generate an electrical signal in response to received light and an array of color filters disposed over the array of photo detectors such that the photo detectors receive light passing through the color filters. The array of color filters includes a first plurality of the color filters having a first color transmission characteristic and disposed over a first plurality of the photo detectors, a second plurality of the color filters having a second color transmission characteristic and disposed over a second plurality of the photo detectors, and a third plurality of the color filters having a third color transmission characteristic and disposed over a third plurality of the photo detectors, wherein the first, second and third color transmission characteristics are different from each other. The array of photo detectors has a first absorption coefficient corresponding to the first color transmission characteristic, a second absorption coefficient corresponding to the second color transmission characteristic, and a third absorption coefficient corresponding to the third color transmission characteristic. The first absorption coefficient is greater than the second absorption coefficient, and the second absorption coefficient is greater than the third absorption coefficient. The third plurality of the color filters covers a larger area of the array of photo detectors than does the second plurality of the color filters, and the second plurality of the color filters covers a larger area of the array of photo detectors than does the first plurality of the color filters.

Other objects and features of the present invention will become apparent by a review of the specification, claims and appended figures.

DETAILED DESCRIPTION OF THE INVENTION

Figure 2:
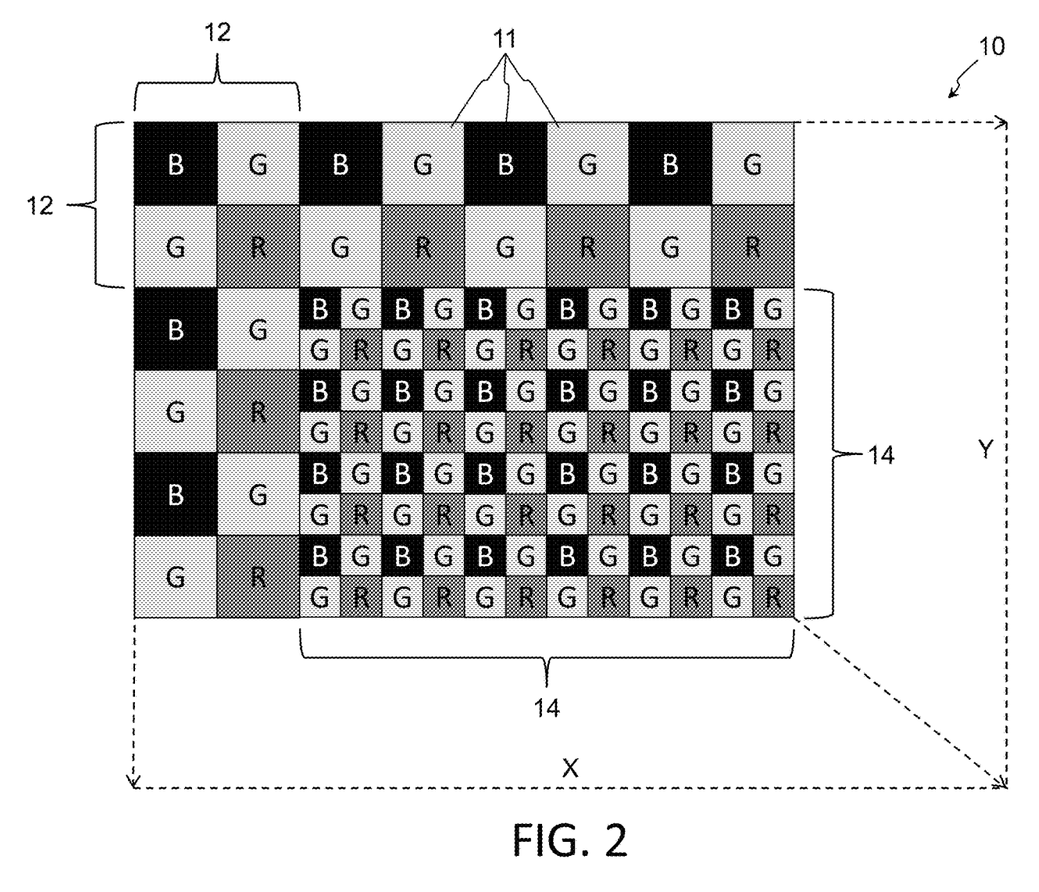
FIG. 2 is a schematic top view of a color filter pattern of the present invention.

The present invention is an improved color filter configuration for an array of rows and columns of photo detectors. FIG. 2 illustrates the upper left-hand corner of the color filter array configuration 10, which enhances edge pixel quantum efficiency. The color filter array 10 includes a plurality of individual color filters 11 arranged in an array, preferably but not necessarily formed contiguously together. Each color filter has a color transmission characteristic that dictates which color of light it will pass while blocking other colors of light. For example, a blue filter has a blue color transmission characteristic that transmits most or all of certain blue light wavelengths, while absorbing or blocking most or all of other colors of light, whereas a red filter has a red color transmission characteristic that transmits most or all of certain red light wavelengths, while absorbing or block most or all of other colors of light, and so on. A white filter is either a material or an aperture that has the white color transmission characteristic of passing most or all colors of light. Quantum efficiency worsens toward the edges of an image sensor. Therefore, using a larger area per color on the edge of an image sensor will allow more light of each selected color to be captured, and thus improve quantum efficiency on the edge pixels.

The corner portion of the color filter configuration in FIG. 2 contains two types of color filters 11 that differ in size. The outer color filters 12 are the parent (outer) filters and the inner color filters 14 are the child (inner) filters. The parent color filters 12 are 'n' times the size of their child color filters 14. For the case where the parent color filters 12 are greater in size than their child color filters 14 (which is the case for FIG. 2), then the value of 'n' is greater than 1. For the case where the parent color filters are smaller in size than their child color filters, then the value of 'n' is greater than zero but less than 1. If an additional size of child color filter is to be included (i.e. a child of the child), the current child color filter is considered the parent color filter to the additional color filter size, with a new 'n' value dictating the size relationship between the two. This sizing configuration can be repeated indefinitely to accumulate additional child color filter size(s) in the image sensor array.

The color filter array 10 has a length X, height Y, and a width Z in terms of the number of different color filter sizes. The color filter array 10 as shown in FIG. 2 has a width Z of 2 different color filter sizes. The value 'n' for parent filters 12 and child filters 14 shown in FIG. 2 is 4, meaning that each of the parent color filter 12 is four times greater in size relative to each of the child color filters 14. The pattern of color variation for the parent filters 12 and for the child filters 14 is similar to the Bayer pattern of FIG. 1. Specifically, the odd rows of parent filters 12 include alternating blue and green parent filters (B and G), and the even rows of parent filters 12 include alternating green and red parent filters (G and R). The same color variation pattern is used for child filters 14. However, other color variation patterns, including random and pseudo-random color variation patterns, can be used. Color filter formation and/or deposition processes are well known in the art, and not described in detail herein.

Figure 3:
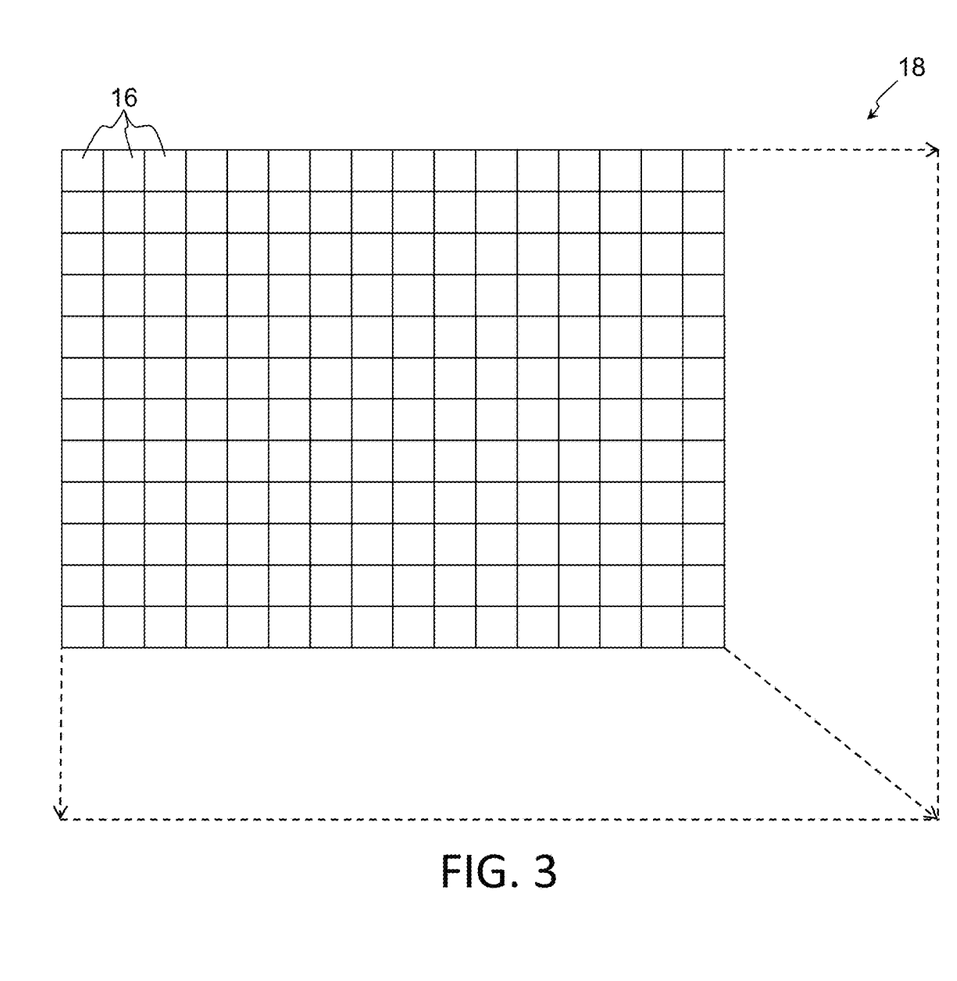
FIG. 3 is a schematic top view of an array of image sensor pixels.

FIG. 3 shows the layout of a conventional photodiode (pixel) array, where rows and columns of pixels 16 are formed in an array 18. Each pixel 16 includes a photoelectric converter (commonly referred to as a photo detector or photodiode). Preferably, each pixel 16 also includes an analog-digital converter, as well as electrical routing and a readout circuit (the readout circuit could be shared among a plurality or even all of the photo detectors). Conventional photodiode pixel arrays are well known in the digital image sensor industry. Each of the squares in FIG. 3 represents a single pixel 16. FIG. 3 shows a conventional pixel layout design with no alteration to pixel shape or size (i.e. all the pixels 16 are the same size). The color filter array 10 of FIG. 2 can be applied to the photodiode pixel array 18 of FIG. 3, where the parent filters 12 are each assigned to (e.g. covers) a plurality of the pixels, while the child filters 14 each cover fewer or just one of the pixels. By assigning multiple pixels to a single color filter, redundancy is created in case of a dead pixel (whereby other pixels under that same color filter will generate a signal). For the specific case of FIGS. 2 and 3, each parent filter 12 would cover four of the pixels 16, and each child filter 14 would cover just one of the pixels 16.

Figure 4:
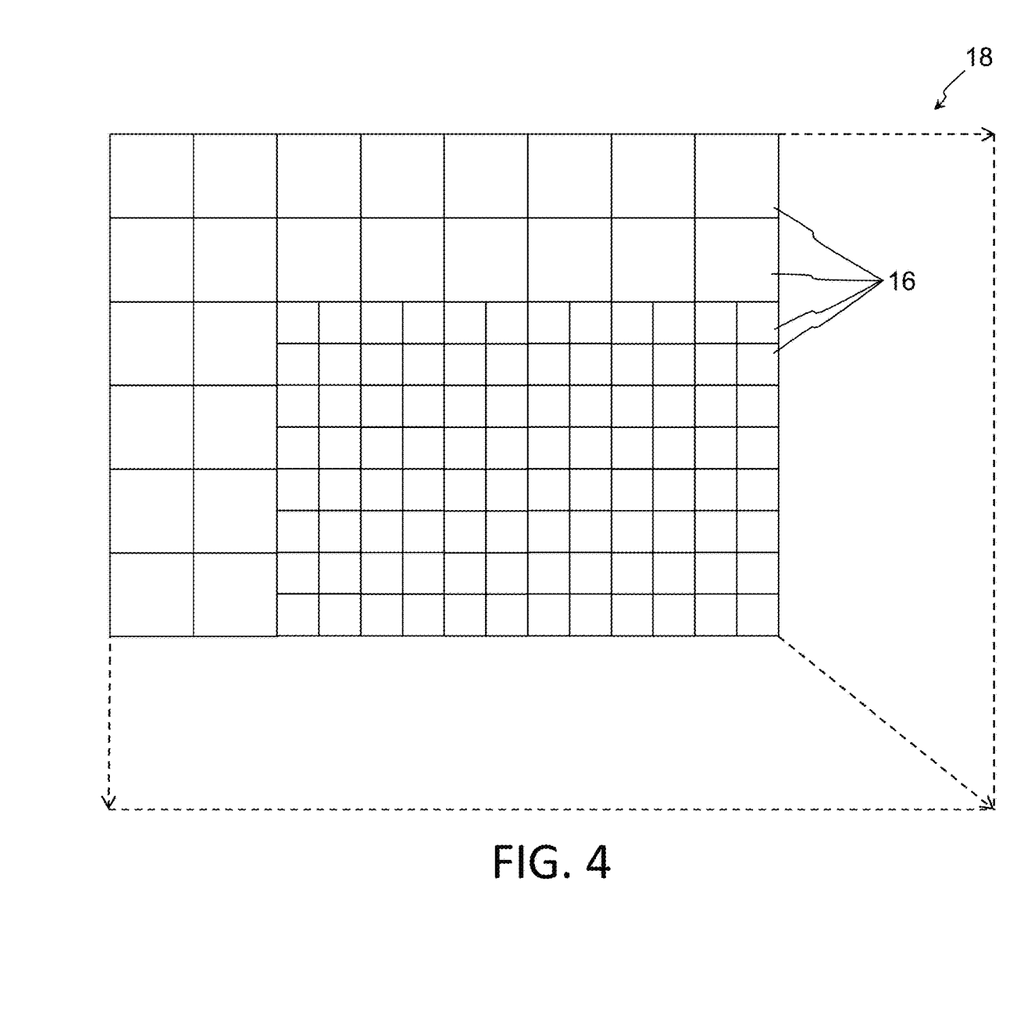
FIG. 4 is a schematic top view of an alternate embodiment of an array of image sensor pixels.

FIG. 4 illustrates an alternate embodiment of the layout of the photodiode (pixel) array 18, whereby the shapes and sizes of the pixels 16 vary in the same manner as the overlying color filters 11 (i.e. a one-to-one correspondence between the sizes and positioning of the pixels 16 and the overlying color filters 11. In this example, the sizes and positions of pixels 16 match that of the sizes and positions of color filters 11 of FIG. 2.

Figure 5:
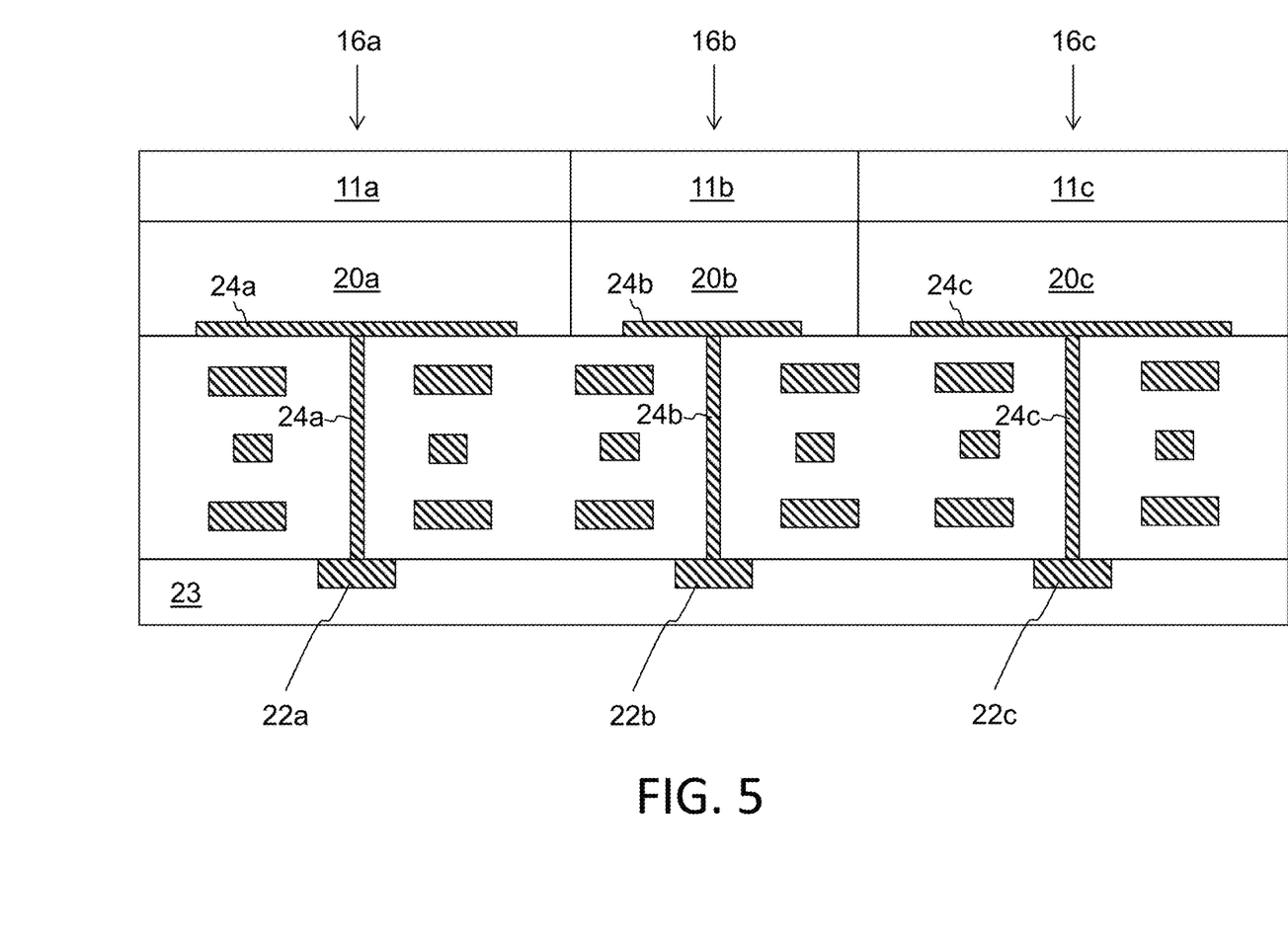
FIG. 5 is a side cross sectional view of image sensor pixels with corresponding color filters.

FIG. 5 illustrates cross sectional views of three exemplary pixels 16a, 16b, 16c together with their overlaying color filters 11a, 11b, 11c, where the varying locations and sizes of the color filters 11 and pixels 16 are matched to each other. Each pixel 16 includes a photo detector 20, an analog to digital converter 22 and electrical routing 24 connecting the two. Preferably, one or more portions of the pixels 16 are formed on or in a silicon substrate 23. In this example, pixel 16b and its associated color filter 11b are laterally smaller than pixels 16a and 16c and their associated color filters 11a and 11c. Specifically, photo detector 20b and electrical route 24b are smaller than those in pixels 16a and 16c. The size of analog to digital converter 22b can be the same or smaller than those in pixels 16a and 16c.

Figure 6:
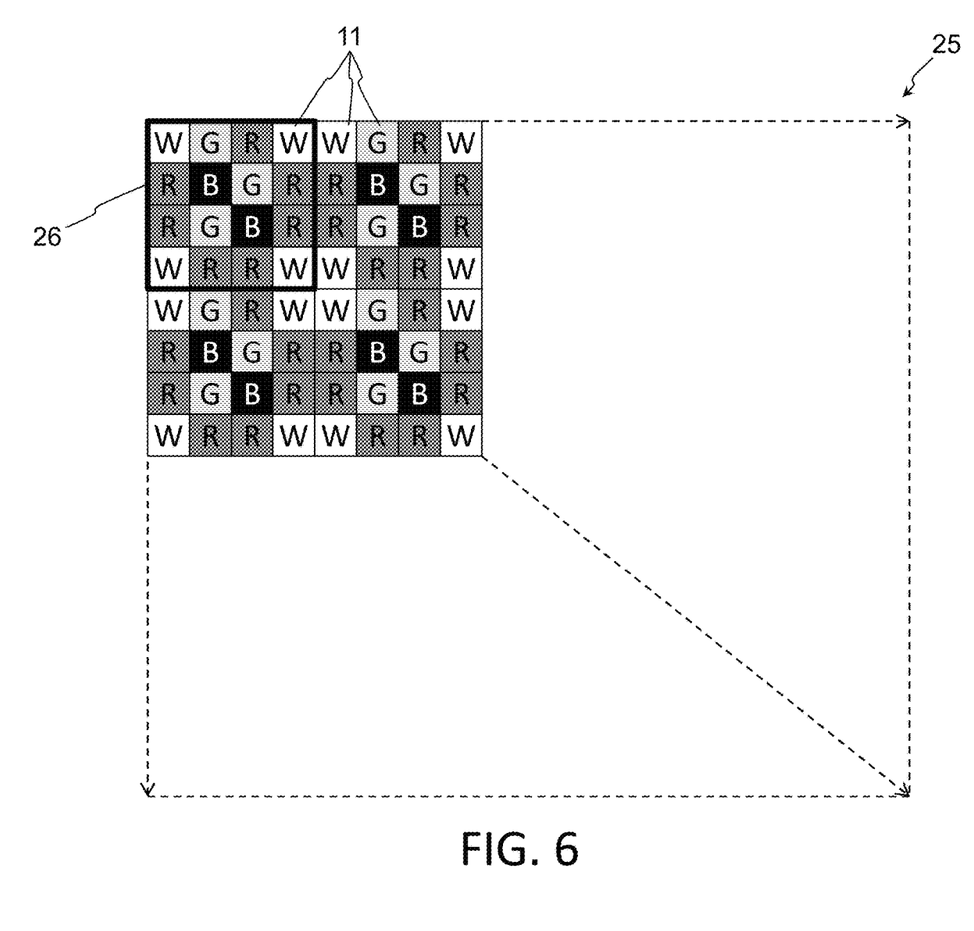
FIG. 6 is a schematic top view of an alternate embodiment of a color filter pattern.

FIG. 6 illustrates a color filter pattern 25 that provides a semi-balanced color allocation given the absorption coefficients of the materials used for the photo detectors, while still maintaining high luminance. The photo detectors 20 can be an organic film, silicon or any other photoelectric converter material known in the art. Table 2 below shows exemplary absorption coefficients of colors blue, green and red in the case where the photo detectors 20 are made of silicon. It should be noted that other colors can be considered rather than blue/green/red/white combinations. The ratio between the different colors is derived from the absorption coefficients. Using the ratios, the percentage of surface area needed for each color is derived to achieve a balanced absorption rate across the chosen color spectrum.

TABLE 2

| Color | Wavelength (nm) | Absorption coefficient (1/cm) | Ratio | Preferred surface area (%) | Rounded surface area (%) |
|---|---|---|---|---|---|
| Blue | 475 | 1,6000 | 1.00 | 11.99% | 12% |
| Green | 510 | 9700 | 1.65 | 19.78% | 20% |
| Red | 650 | 2810 | 5.69 | 68.23% | 68% |

In FIG. 6, a repeating block 26 of color filters 11 that is 4×4 square in size (i.e. sixteen color filters total) is used as an example for creating the semi-balanced color filter pattern. However, other sizes and shapes (e.g., rectangles, irregular shapes) can also be used. The more color filters that are included in the repeating block 26, the better balance that can be achieved. Of the sixteen color filters 11 in each 4×4 square, four of the color filters are chosen to be white, so that these white color filters account for 25% of the total area. The relative number of white color filters used on the color filter pattern can vary based upon the desired luminance. It is preferably to use white color filters to improve overall luminance, but the use of white color filters is not required. When calculating the number of squares to assign for each non-white color for color balance, white color filters are excluded from the surface area calculation. So, for the repeating pattern in FIG. 6, the four white filters are excluded from the original sixteen filters, which leave twelve available filters to populate.

The ratio of color filters to populate the remaining area is selected to be as close to the "preferred surface area (%)" as possible for the particular material used for the photo detectors and the number of filters in the repeating block 26. As shown in Table 3 below, selecting two blue filters, three green filters and seven red filters for each 4×4 repeating block 26 results in the following surface area percentages: 25% white, 18.75% green, 12.5% blue and 43.75% red. Therefore this semi balanced color filter pattern has luminance efficiency close to a RGBW pattern, yet has almost double the red color absorption. The placement of each color filter in the 4×4 square can be random or pseudo-random. It is preferred to spread the colors out as much as possible rather than having large clusters of a single color. This repeating pattern technique of FIG. 6 for semi-balanced color allocation can be combined with the edge quantum efficiency technique of FIGS. 2-4 (i.e., the parent filters 12 can incorporate the semi-balanced repeating blocks 26, as can the child filters). The combination results in better color balance in the center of the photo detector array as well as at its edges, along with better quantum efficiency at the array edges.

TABLE 3

| Color | Rounded preferred surface area (%) | Actual surface area (%) |
|---|---|---|
| Blue | 12% | 2/12 = 17.7% |
| Green | 20% | 3/12 = 25% |
| Red | 68% | 7/12 = 58.3% |

FIGS. 7-10 illustrates techniques for complete color filter balance. In contrast with the semi-balanced configuration above that uses equal sized and shaped filters to bring in as much balance as possible, complete color balance is achieved by moving away from equally sized and shaped filters and photo detectors. The photo detectors and their associated color filters having unique shapes and sizes to provide percentage surface areas that closely or exactly match the preferred surface area percentage called for by the photo detector absorption coefficients. The pattern of the color filters can be random or pseudo-random, as this configuration is not limited to any particular pattern. As with the examples above, it is preferred (but not necessary) to have some amount of white pixels to enhance the luminance of nearby pixels.

Figure 7:
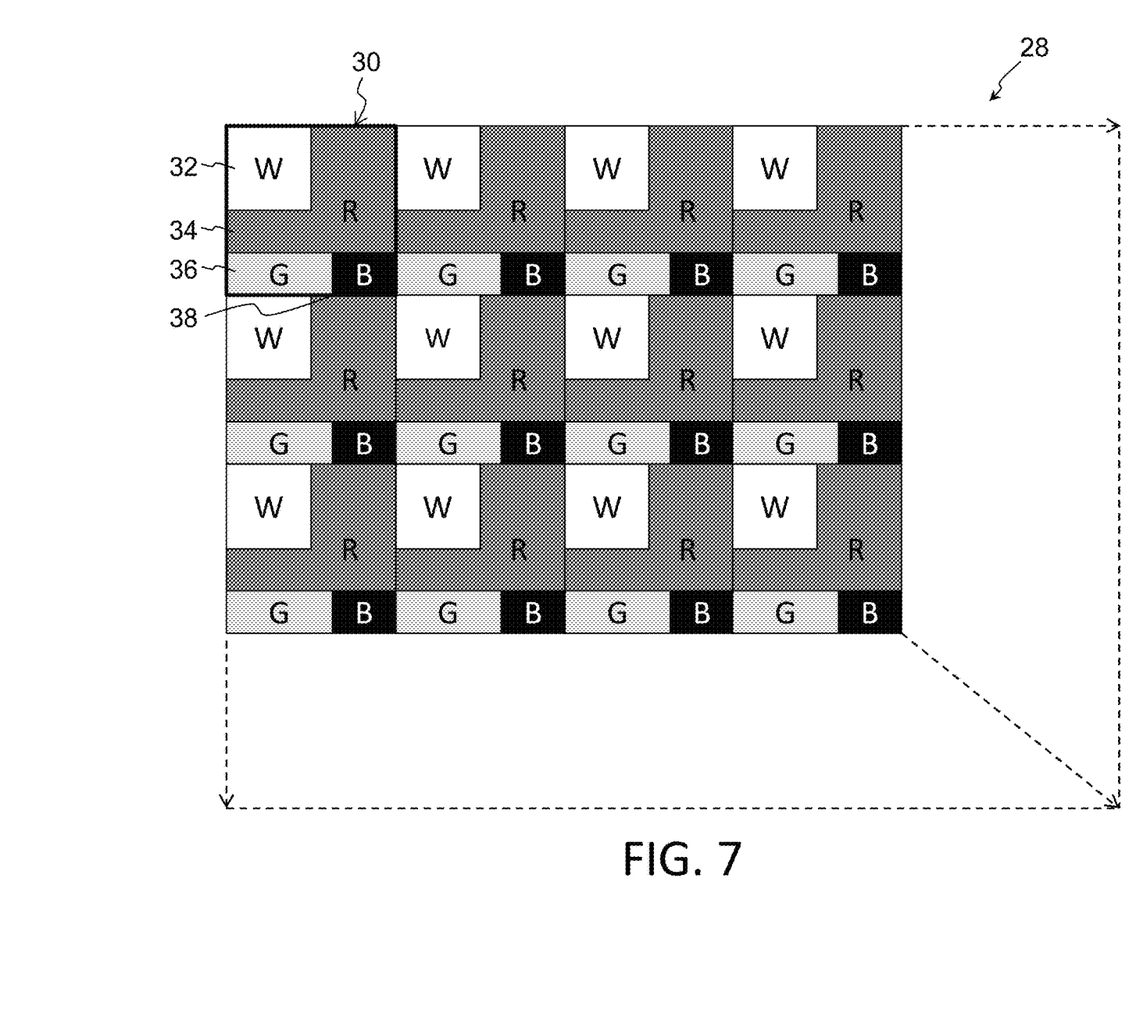
FIG. 7 is a schematic top view of an alternate embodiment of a color filter pattern.

FIG. 7 shows one example of a color filter pattern 28 that can provide perfect color balance. The various color filters are configured in repeating blocks 30 of color filters, where each repeating block 30 contains a white filter 32, a red filter 34, a green filter 36 and a blue filter 38. This configuration achieves the perfect desired surface area percentages between the red, green and blue filters by having at least one of the color filters being irregularly shaped (e.g. not square or rectangular). In this example, the red filter 34 is irregularly shaped (pseudo "L" shaped). This allows for square or rectangular shaped green and blue filters to achieve the desired relative sizes with respect to the red filter (in this case, for silicon photo detectors, relative sizes of 11.99%, 19.78% and 68.23% for the blue, green and red filters respectively). It also allows for the desired relative size of the white filter. It should be noted that other colors can be considered rather than red/green/blue and white combinations.

Figure 8:
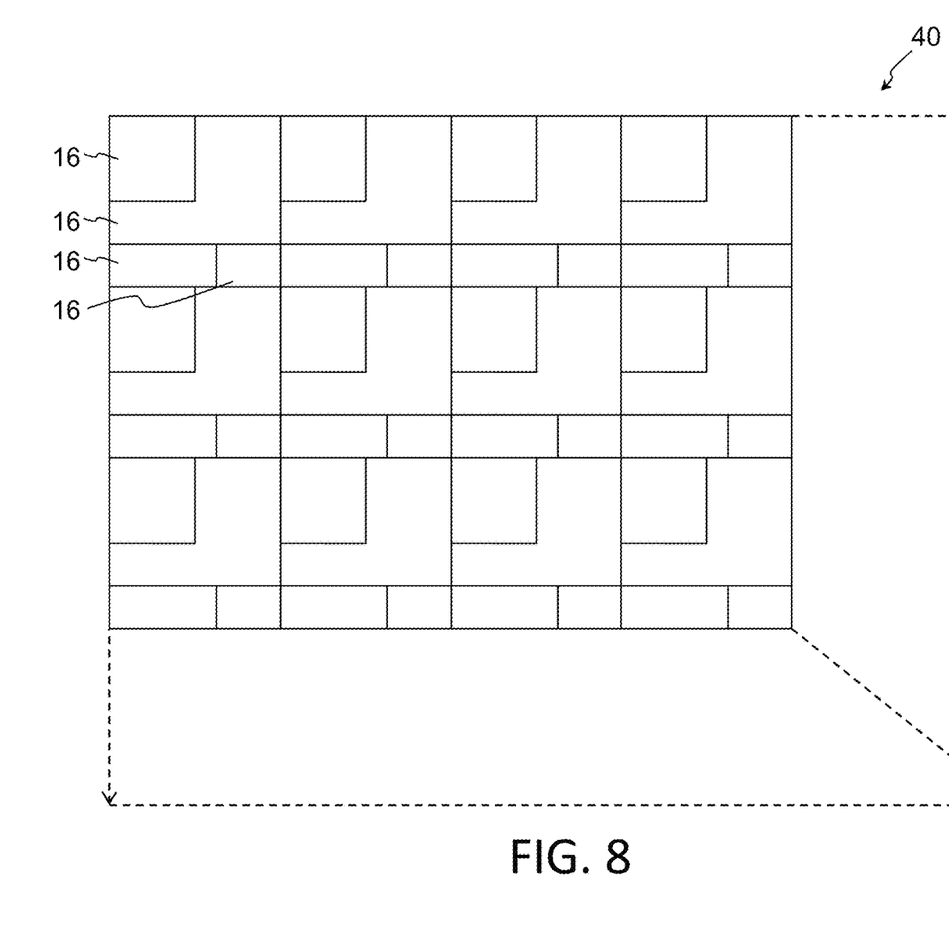
FIG. 8 is a schematic top view of an alternate embodiment of an array of image sensor pixels.

FIG. 8 shows an array of pixels 40 ideal for the color filter pattern 28 of FIG. 7, where pixels 16 have the same shape and size as the color filters in repeating block 30. It should be noted that repeating blocks 30 of FIGS. 7 and 8 can be combined with the edge quantum efficiency technique of FIGS. 2-4 (i.e., the parent and child filters can incorporate repeating blocks 30 so that repeating blocks 30 near the array edges are larger than those nearer the center of the array).

Figure 9:
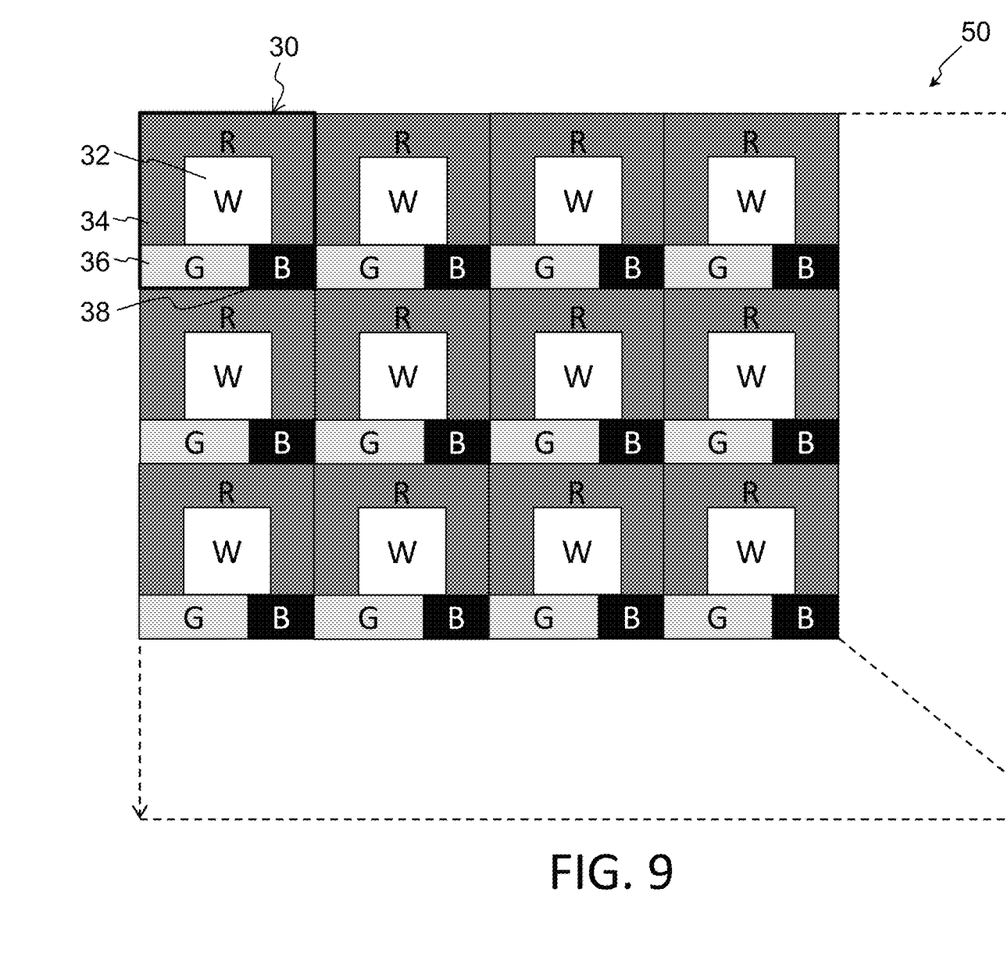
FIG. 9 is a schematic top view of an alternate embodiment of a color filter pattern.
Figure 10:
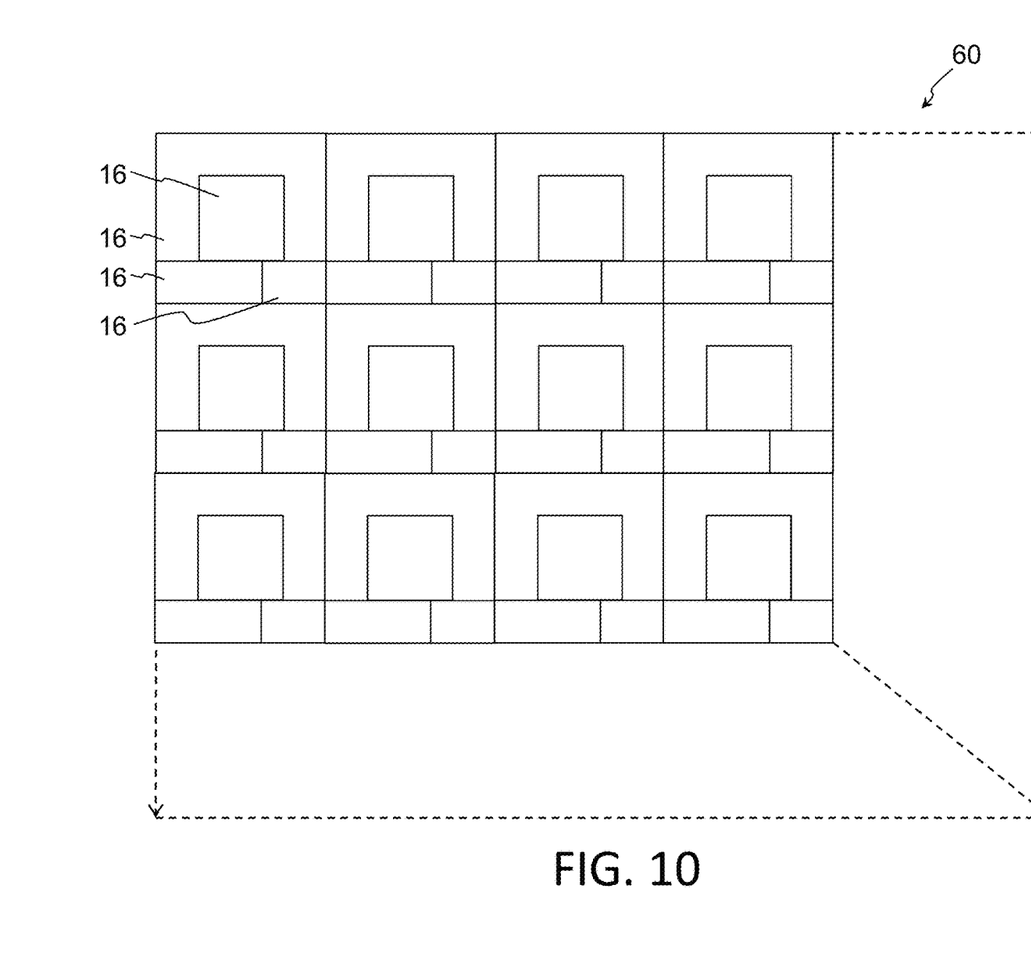
FIG. 10 is a schematic top view of an alternate embodiment of an array of image sensor pixels.

FIG. 9 shows another example of a color filter pattern 50, which is similar to that of FIG. 7 except that the irregular shape of the red filter 34 is pseudo "U" shaped. FIG. 10 shows an array of pixels 60 ideal for the color filter pattern 50 of FIG. 8, where pixels 16 have the same shape and size as the color filters in repeating block 30 of pattern 50. It should be noted that repeating blocks 30 of FIGS. 9 and 10 can be combined with the edge quantum efficiency technique of FIGS. 2-4 (i.e., the parent and child filters can incorporate repeating blocks 30 so that repeating blocks 30 near the array edges are larger than those nearer the center of the array).

Figure 11:
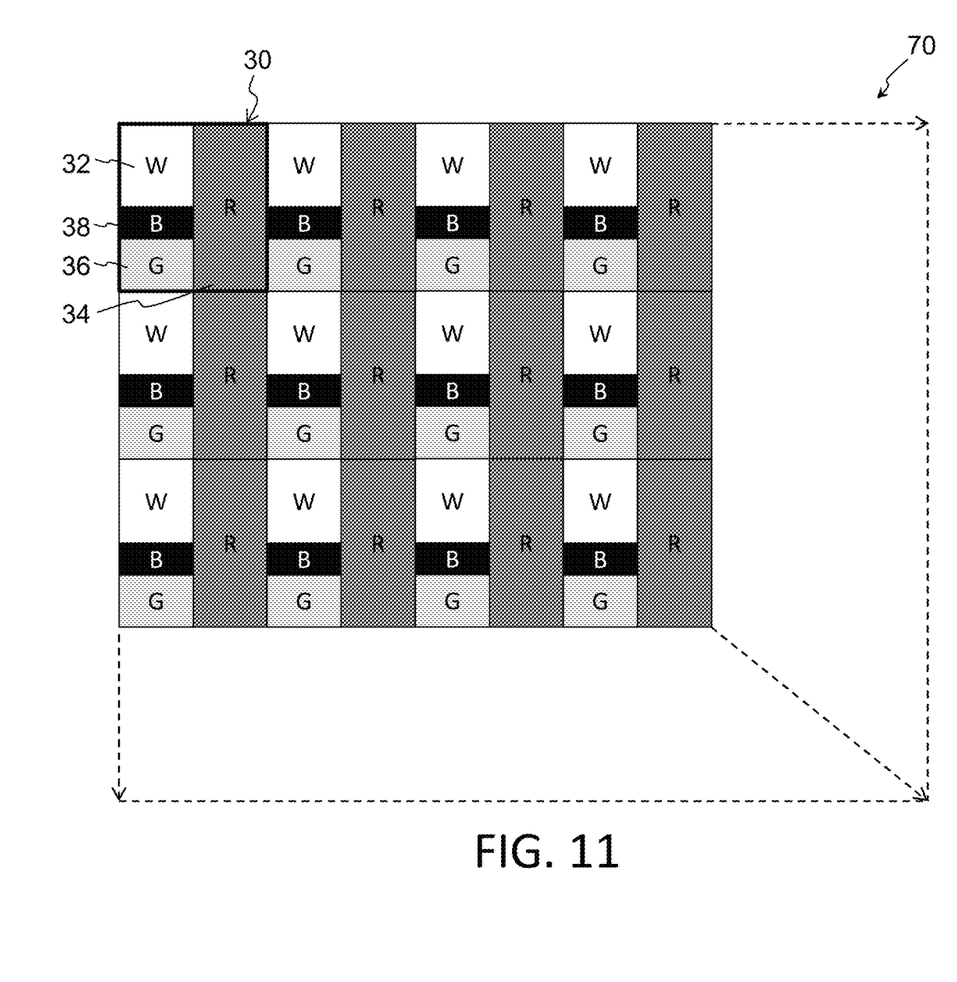
FIG. 11 is a schematic top view of an alternate embodiment of a color filter pattern.
Figure 12:
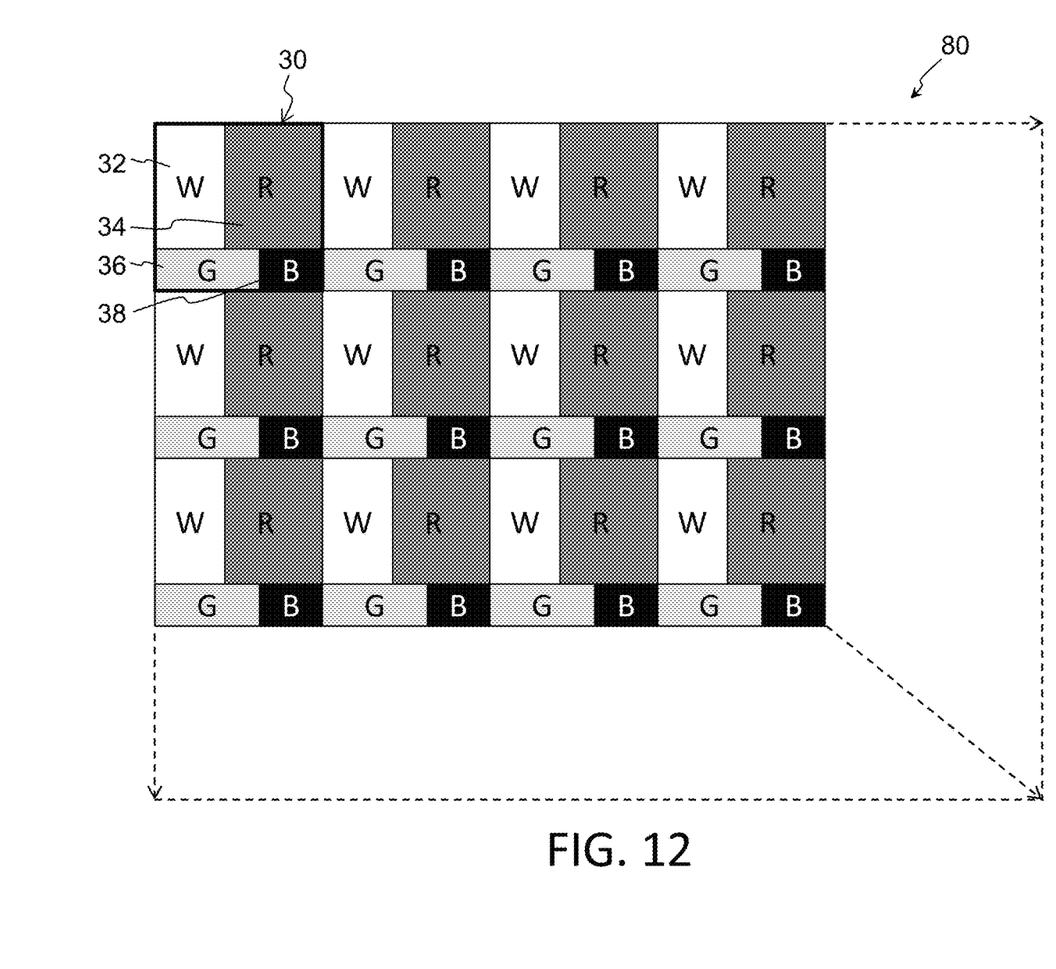
FIG. 12 is a schematic top view of an alternate embodiment of a color filter pattern.

FIGS. 11 and 12 illustrate additional examples of color filter patterns 70 and 80, which achieve perfect color balance without irregular shaped filter shapes. In these patterns, all of the filter shapes are square or rectangular, which simplifies complexity in fabrication of both the color filter patterns and the underlying pixels.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Lastly, a single layer of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An imaging device, comprising:
   an array of photo detectors each configured to generate an electrical signal in response to received light, wherein the photo detectors all have a same lateral size; and
   an array of solid material color filters disposed over the array of photo detectors such that the photo detectors receive light passing through the color filters, wherein:
   each of the color filters has a color transmission characteristic,
   the color transmission characteristic of some of the color filters is different from that of others of the color filters,
   a first plurality of the color filters each of which is disposed over a plurality of the photo detectors, and
   a second plurality of the color filters each of which is disposed over only one of the photo detectors;
   wherein the first plurality of color filters is disposed along edges of the array of color filters, and the second plurality of color filters is disposed in an inner area of the array of color filters.

2. The imaging device of claim 1, wherein the first plurality of color filters includes a first sub-plurality of the color filters having a first color transmission characteristic, a second sub-plurality of the color filters having a second color transmission characteristic, and a third a third sub-plurality of the color filters having a third color transmission characteristic, and wherein the first, second and third color transmission characteristics are different from each other.

3. The imaging device of claim 2, wherein the second plurality of color filters includes a first sub-plurality of the color filters having the first color transmission characteristic, a second sub-plurality of the color filters having the second color transmission characteristic, and a third a third sub-plurality of the color filters having the third color transmission characteristic.

4. The imaging device of claim 3, wherein:
   the first color transmission characteristic is a red color transmission characteristic;
   the second color transmission characteristic is a green color transmission characteristic; and
   the third color transmission characteristic is a blue color transmission characteristic.

5. The imaging device of claim 2, wherein:
   the first plurality of color filters includes a fourth sub-plurality of the color filters having a fourth color transmission characteristic different from the first, second and third color transmission characteristics.
   the second plurality of color filters includes a first sub-plurality of the color filters having the first color transmission characteristic, a second sub-plurality of the color filters having the second color transmission characteristic, a third a third sub-plurality of the color filters having the third color transmission characteristic, and a fourth sub-plurality of the color filters having the fourth color transmission characteristic.

6. The imaging device of claim 5, wherein:
   the first color transmission characteristic is a red color transmission characteristic;
   the second color transmission characteristic is a green color transmission characteristic;
   the third color transmission characteristic is a blue color transmission characteristic; and
   the fourth color transmission characteristic is a white color transmission characteristic.

7. An imaging device, comprising:
   an array of photo detectors each configured to generate an electrical signal in response to received light;
   an array of solid material color filters disposed over the array of photo detectors such that the photo detectors receive light passing through the color filters, wherein each of the color filters is disposed over and has a lateral size matching that of only one of the photo detectors, and wherein the array of color filters includes:
   a first plurality of the color filters having a first color transmission characteristic and disposed over a first plurality of the photo detectors, wherein the first plurality of color filters includes a first sub-plurality thereof having a lateral size larger than that of a second sub-plurality of the first plurality of color filters,
   a second plurality of the color filters having a second color transmission characteristic and disposed over a second plurality of the photo detectors, wherein the second plurality of color filters includes a first sub-plurality thereof having a lateral size larger than that of a second sub-plurality of the second plurality of color filters, and a third plurality of the color filters having a third color transmission characteristic and disposed over a third plurality of the photo detectors, wherein the third plurality of color filters includes a first sub-plurality thereof having a lateral size larger than that of a second sub-plurality of the third plurality of color filters, wherein the first, second and third color transmission characteristics are different from each other;

the array of photo detectors having a first absorption coefficient corresponding to the first color transmission characteristic, a second absorption coefficient corresponding to the second color transmission characteristic, and a third absorption coefficient corresponding to the third color transmission characteristic, wherein the first absorption coefficient is greater than the second absorption coefficient, and the second absorption coefficient is greater than the third absorption coefficient;

the third plurality of the color filters covers a larger area of the array of photo detectors than does the second plurality of the color filters; and the second plurality of the color filters covers a larger area of the array of photo detectors than does the first plurality of the color filters.

8. The imaging device of claim 7, wherein:
the third plurality of the photo detectors includes a greater number of the photo detectors than does the second plurality of the photo detectors;
the second plurality of the photo detectors includes a greater number of the photo detectors than does the first plurality of the photo detectors;
the third plurality of the color filters includes a greater number of the color filters than does the second plurality of the color filters; and
the second plurality of the color filters includes a greater number of the color filters than does the first plurality of the color filters.

9. The imaging device of claim 7, wherein the array of color filters further includes a fourth plurality of the color filters having a white color transmission characteristic and disposed over a fourth plurality of the photo detectors, wherein the fourth plurality of color filters includes a first sub-plurality thereof having a lateral size larger than that of a second sub-plurality of the fourth plurality of color filters.

10. The imaging device of claim 9, wherein:
the first color transmission characteristic is a blue color transmission characteristic;
the second color transmission characteristic is a green color transmission characteristic; and
the third color transmission characteristic is a red color transmission characteristic.

11. The imaging device of claim 7, wherein:
each of the third plurality of the photo detectors is larger in lateral size than each of the second plurality of the photo detectors;
each of the second plurality of the photo detectors is larger in lateral size than each of the first plurality of the photo detectors;
each of the third plurality of the color filters is larger in lateral size than each of the second plurality of the color filters; and
each of the second plurality of the color filters is larger in lateral size than each of the first plurality of the color filters.

12. The imaging device of claim 11, wherein the array of color filters is arranged in repeating blocks of the color filters, and wherein each of the repeating blocks includes only one of the first plurality of the color filters, only one of the second plurality of the color filters, and only one of the third plurality of the color filters.

13. The imaging device of claim 12, wherein the array of color filters further includes a fourth plurality of the color filters having a white color transmission characteristic and disposed over a fourth plurality of the photo detectors, and wherein each of the repeating blocks includes only one of the fourth plurality of the color filters.

14. The imaging device of claim 13, wherein:
the first color transmission characteristic is a blue color transmission characteristic;
the second color transmission characteristic is a green color transmission characteristic; and
the third color transmission characteristic is a red color transmission characteristic.

15. The imaging device of claim 11, wherein each of the third plurality of the color filters is L-shaped.

16. The imaging device of claim 15, wherein each of the third plurality of the photo detectors is L-shaped.

17. The imaging device of claim 11, wherein each of the third plurality of the color filters is U-shaped.

18. The imaging device of claim 17, wherein each of the third plurality of the photo detectors is U-shaped.

* * * * *